United States Patent
Kuttner

(10) Patent No.: US 11,750,209 B2
(45) Date of Patent: Sep. 5, 2023

(54) DIGITAL-TO-ANALOG CONVERTER, TRANSMITTER AND MOBILE DEVICE

(71) Applicant: Intel Corporation

(72) Inventor: Franz Kuttner, St. Ulrich (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/310,860

(22) PCT Filed: Feb. 26, 2020

(86) PCT No.: PCT/US2020/019778
§ 371 (c)(1),
(2) Date: Aug. 27, 2021

(87) PCT Pub. No.: WO2020/205094
PCT Pub. Date: Oct. 8, 2020

(65) Prior Publication Data
US 2022/0190841 A1    Jun. 16, 2022

(30) Foreign Application Priority Data

Mar. 29, 2019 (DE) .......... 102019108180.7

(51) Int. Cl.
*H03M 1/80* (2006.01)
*H04B 1/04* (2006.01)
*H03K 19/20* (2006.01)

(52) U.S. Cl.
CPC .............. *H03M 1/802* (2013.01); *H04B 1/04* (2013.01); *H03K 19/20* (2013.01)

(58) Field of Classification Search
CPC .......... H03K 19/20; H03M 1/06; H03M 1/66; H03M 1/78; H03M 1/80; H03M 1/802;
(Continued)

(56) References Cited

U.S. PATENT DOCUMENTS

2007/0194963 A1* 8/2007 Sasaki ................. H03K 17/162
341/144
2010/0097253 A1    4/2010 Mu
(Continued)

FOREIGN PATENT DOCUMENTS

| JP | 2007-227990 A | 9/2007 |
|---|---|---|
| JP | 2012-514406 A | 6/2012 |
| KR | 2015-0022151 A | 3/2015 |

*Primary Examiner* — Shawkat M Ali
(74) *Attorney, Agent, or Firm* — 2SPL Patent Attorneys PartG mbB; Yong Beom Hwang

(57) ABSTRACT

A digital-to-analog converter is provided. The digital-to-analog converter includes a plurality of digital-to-analog converter cells coupled to an output node of the digital-to-analog converter. At least one of the plurality of digital-to-analog converter cells includes a capacitive element configured to provide an analog output signal of the digital-to-analog converter cell to the output node. Further, the at least one of the plurality of digital-to-analog converter cells includes an inverter circuit coupled to the capacitive element. The inverter circuit is configured to generate an inverter signal for the capacitive element based on an oscillation signal. The at least one of the plurality of digital-to-analog converter cells additionally includes a resistive element coupled to the inverter circuit and the capacitive element. A resistance of the resistive element is at least 50Ω.

20 Claims, 6 Drawing Sheets

(58) Field of Classification Search
CPC .... H04B 1/04; H04B 1/26; H04L 1/22; H04L 7/00; H04L 27/00
USPC ........ 341/135, 144, 150, 153, 154; 375/219, 375/295, 316
See application file for complete search history.

(56) References Cited

U.S. PATENT DOCUMENTS

| | | | |
|---|---|---|---|
| 2011/0210881 A1* | 9/2011 | Vilhonen | H03M 1/802 |
| | | | 341/150 |
| 2014/0347203 A1 | 11/2014 | Kuttner et al. | |
| 2016/0173269 A1* | 6/2016 | Kuttner | H04L 7/0083 |
| | | | 341/150 |
| 2019/0036541 A1* | 1/2019 | Wong | H03M 1/747 |
| 2019/0068179 A1 | 2/2019 | Chen et al. | |

\* cited by examiner

DIGITAL-TO-ANALOG CONVERTER, TRANSMITTER AND MOBILE DEVICE

FIELD

The present disclosure relates to digital-to-analog conversion. In particular, examples relate to a Digital-to-Analog Converter (DAC), a transmitter and a mobile device.

BACKGROUND

DACs are used for converting digital signals into analog signals. For example, capacitive Radio Frequency (RF) DACs are used for direct generation of analog RF transmit signals based on digital baseband transmit signals.

The performance of a DAC such as a RFDAC can, e.g., be described by its efficiency, its maximum output power, its frequency range or its linearity. For an RFDAC, the linearity defines the far off noise and the Adjacent Channel Leakage Ratio (ACLR) of the analog RF signal generated by the RFDAC. One aspect influencing the ACLR of the analog RF signal is the non-linear output of the last inverters in the individual cells of the RFDAC. For example, if the RFDAC is implemented in Metal-Oxide-Semiconductor (MOS)-technology, the finite, non-linear MOS resistance of the inverter's components and the aspect that the on-resistance of the inverter's NMOS (n-type MOS)-components is not exactly equal to the on-resistance of the inverter's PMOS (p-type MOS)-components causes harmonic distortion in the analog RF signal. The harmonic distortion is visible as ACLR and causes a degraded Error Vector Magnitude (EVM).

Hence, there may be a desire for an improved DAC architecture.

BRIEF DESCRIPTION OF THE FIGURES

Some examples of apparatuses and/or methods will be described in the following by way of example only, and with reference to the accompanying figures, in which

FIG. 6 illustrates another example of a DAC cell; and

DETAILED DESCRIPTION

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some particular examples thereof are shown in the figures and will subsequently be described in detail. However, this detailed description does not limit further examples to the particular forms described. Further examples may cover all modifications, equivalents, and alternatives falling within the scope of the disclosure. Same or like numbers refer to like or similar elements throughout the description of the figures, which may be implemented identically or in modified form when compared to one another while providing for the same or a similar functionality.

It will be understood that when an element is referred to as being "connected" or "coupled" to another element, the elements may be directly connected or coupled or via one or more intervening elements. If two elements A and B are combined using an "or", this is to be understood to disclose all possible combinations, i.e. only A, only B as well as A and B, if not explicitly or implicitly defined otherwise. An alternative wording for the same combinations is "at least one of A and B" or "A and/or B". The same applies, mutatis mutandis, for combinations of more than two elements.

The terminology used herein for the purpose of describing particular examples is not intended to be limiting for further examples. Whenever a singular form such as "a", "an" and "the" is used and using only a single element is neither explicitly or implicitly defined as being mandatory, further examples may also use plural elements to implement the same functionality. Likewise, when a functionality is subsequently described as being implemented using multiple elements, further examples may implement the same functionality using a single element or processing entity. It will be further understood that the terms "comprises", "comprising", "includes" and/or "including," when used, specify the presence of the stated features, integers, steps, operations, processes, acts, elements and/or components, but do not preclude the presence or addition of one or more other features, integers, steps, operations, processes, acts, elements, components and/or any group thereof.

Unless otherwise defined, all terms (including technical and scientific terms) are used herein in their ordinary meaning of the art to which the examples belong.

Figure 1:
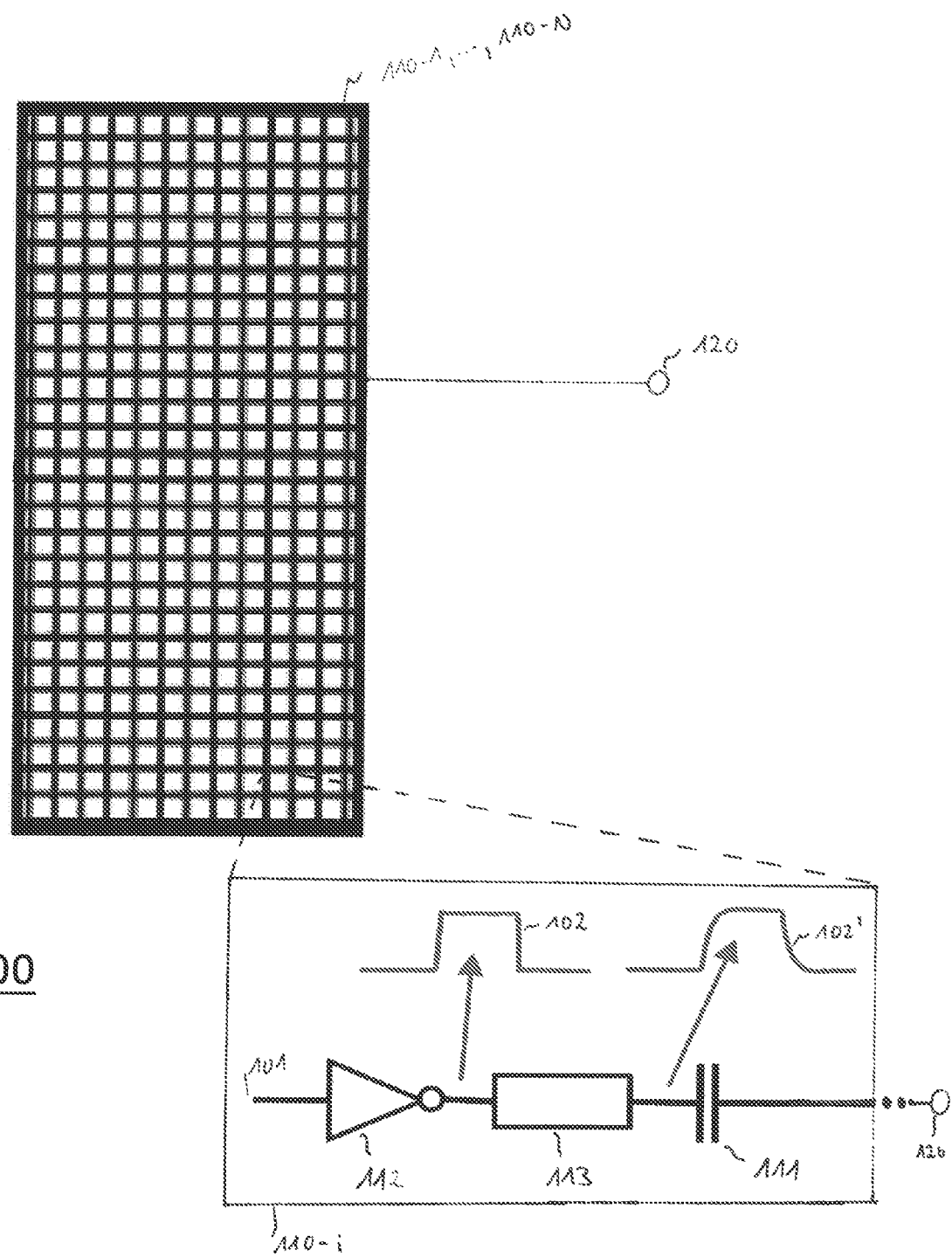
FIG. 1 illustrates an example of a DAC.

FIG. 1 illustrates an exemplary DAC 100. The DAC 100 comprises a plurality of DAC cells 110-1, . . . , 110-N. The plurality of DAC cells 110-1, . . . , 110-N may be any number N≥2 of DAC cells (e.g. related to a desired resolution of the DAC). The plurality of DAC cells 110-1, . . . , 110-N are coupled to an output node 120 of the DAC 100.

At least one DAC cell 110-$i$ (1≤$i$≤N) of the plurality of DAC cells 110-1, . . . , 110-N comprises a capacitive element 111 configured to supply an analog output signal of the DAC cell 110-$i$ to the output node 120. For example, the capacitive element 111 may be an on-chip capacitor (e.g. implemented within metal layers or by trenches within a semiconductor substrate). However, the capacitive element 111 may also be any other suitable means for providing a capacitance. The capacitive element 111 may, e.g., exhibit a capacitance of a few femto-farad (e.g. between 1 and 5 fF).

The DAC cell 110-$i$ may be any cell of the plurality of DAC cells 110-1, . . . , 110-N of the DAC 100.

Further, the at least one DAC cell 110-$i$ comprises an inverter circuit 112 coupled to the capacitive element 111. The inverter circuit is configured to output an inverter signal 102 for the capacitive element 111 based on an oscillation signal 101. The inverter circuit 112 is the last inverter circuit of the DAC cell 110-$i$. In other words, no further inverter circuit is coupled between the inverter circuit 112 and the capacitive element 111.

In various embodiments of the invention, the at least one DAC cell 110-$i$ may be configured to comprise a resistive element 113 coupled to or between the inverter circuit 112 and the capacitive element 111. A resistance of the resistive element is at least 50Ω (Ohm). In other words, an element with a high resistance (compared to, e.g., a conductive trace/path coupling the inverter circuit 112 and the capacitive element 111) is coupled between the inverter circuit 112 and the capacitive element 111.

The resistive element 113 may allow to reduce the parasitic capacitance at the output of the inverter circuit 112, so that effectively only a (very) low parasitic capacitance is present at the output of the inverter circuit 112. The transient response of the inverter circuit 112 may, hence, be substantially unaffected by the charge state of the capacitive element 111. As indicated in FIG. 1, the inverter signal 102 output by the inverter circuit 112 may exhibit a substantially perfect rectangular waveform. Merely the inverter signal 102' after the resistive element 113 is affected by the parasitic capacitance of the capacitive element 111. However, the RC time constant of the resistive element 113 and the capacitive element 111 exhibits a linear behavior and does therefore not generate nonlinearities. Accordingly, providing the linear resistive element 113 between the inverter circuit 112 and the capacitive element 111 may allow to linearize the output stage of the DAC cell 110-i.

The resistive element 113 may be implemented in many different ways. For example, the resistive element 113 may be a thin film resistor or a polysilicon resistor. In other examples, the resistive element 113 may be a transistor, which may be operated as resistor with adjustable resistance. For example, a control terminal of the transistor (e.g. a gate terminal) may be configured to receive a control signal for adjusting a resistance between an input terminal (e.g. a source terminal) and an output terminal (e.g. a drain terminal) of the transistor to a desired value.

In some example, the resistance of the resistive element 113 may be higher than 50Ω. For example, the resistance of the resistive element 113 may be at least 500Ω, 1000Ω, 1500Ω, 2000Ω, 2500Ω, 3000Ω, 3500Ω, 4000Ω, 5000Ω, 6000Ω or 7000Ω. A higher resistance of the resistive element 113 results in increased linearity of the at least one DAC cell 110-i. Accordingly, a linearity of the at least one DAC cell 110-i may be increased by selecting a higher resistance value for the resistive element 113.

For further increasing the linearity of the at least one DAC cell 110-I, transistors with low threshold voltage may be used for the inverter circuit 112. The threshold voltage is the minimum voltage between a control terminal and an input terminal of a transistor that is needed to create a conducting path between the input and the output terminals of the transistor. For example, for a Field-Effect Transistor (FET), the threshold voltage is the minimum gate-tosource voltage that is needed to create a conducting path between the source and drain terminals. If the inverter circuit 112 is implemented in Complementary MOS (CMOS) technique, the inverter circuit 112 comprises at least two transistors of different conductivity (e.g. an NMOS and a PMOS FET; not illustrated) serially coupled between a first potential (e.g. a supply voltage $V_{dd}$) and a second potential (e.g. ground or a supply voltage $V_{ss}$). The threshold voltage of each of the at least two transistors may be at maximum 15%, 20% or 25% of a potential difference between the first potential and the second potential. In other words, the inverter circuit 112 may use Low Voltage Threshold (LVT) or Ultra Low Voltage Threshold (ULVT) transistors instead of Standard Voltage Threshold (SVT) transistors. Accordingly, the threshold voltage of the inverter circuit 112 is low so that the inverter circuit 112 may enable fast switching. The combination of a fast inverter circuit 112 and the reduced (low) parasitic capacitance at the output of the inverter circuit 112 may enable a nearly perfect rectangular waveform of the inverter signal 102 at the output of the inverter circuit 112.

In the example of FIG. 1, n≤N DAC cells out of the plurality of DAC cells 110-1, . . . , 110-N may be identical to DAC cell 110-i. In some examples, all DAC cells of the plurality of DAC cells 110-1, . . . , 110-N may be identical. In other examples, one or more DAC cells of the plurality of DAC cells 110-1, . . . , 110-N may differ from DAC cell 110-i (e.g. comprise additional or different elements).

The oscillation signal 101 may exhibit a constant phase or be phase modulated. Further, the oscillation signal 101 may be a RF oscillation signal, i.e., a frequency of the oscillation signal 101 may be at least 10, 100, 500, 1000, 1500, 2000 or 5000 MHz. Alternatively, the oscillation signal 101 may exhibit a lower frequency (e.g. less than 1 Mhz, 1 kHz or 100 Hz). For example, the DAC 100 may be used as RFDAC for direct generation of an RF signal or as Capacitive DAC (CDAC) without direct modulation of a RF signal.

Figure 2:
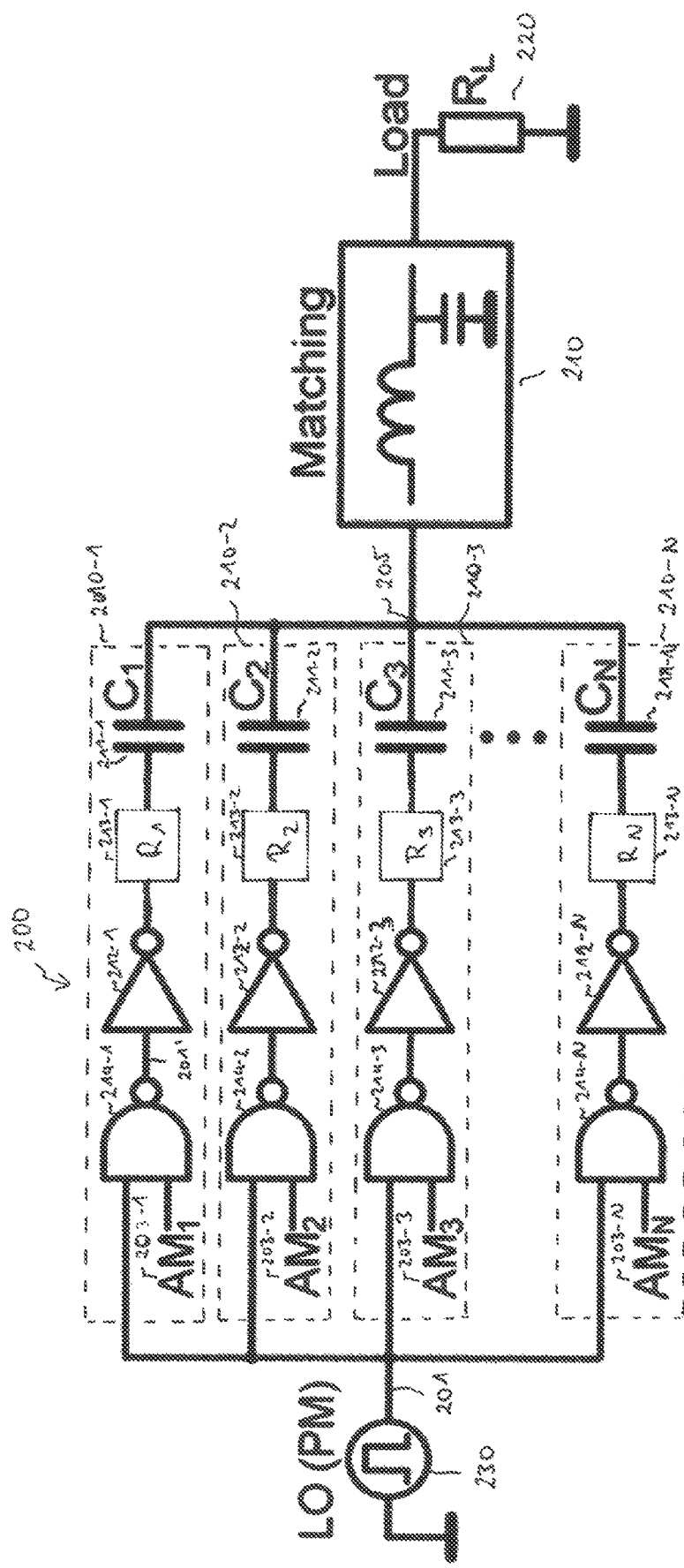
FIG. 2 illustrates another example of a DAC.

Another more detailed example of a DAC 200 which is coupled to a load 220 (e.g. representing an antenna) via a matching circuit 210 is illustrated in FIG. 2. The matching circuit 210 presents a defined inductance to an output node 205 of the DAC 200 in order to maximize the power transfer from the output node 205 of the DAC 200 to the load 220, and to minimize signal reflections from the load 220 back to the output node 205. In the example of FIG. 2, the DAC 200 is operated as an RFDAC for generating a RF transmit signal.

A synthesizer circuit 230 generates a phase modulated RF oscillation signal 201 for the DAC 200 based on data to be wirelessly transmitted (e.g. based on phase information contained in or derived from the data).

The DAC 200 comprises a plurality of DAC cells 210-1, . . . , 210-N, which are coupled to an output node 205 of the DAC. Similar to what is described above for DAC 100, each of the plurality of DAC cells 210-1, . . . , 210-N comprises a respective inverter circuit 212-1, . . . , 212-N (e.g. comprising transistors with low threshold voltage), a respective resistive element 213-1, . . . , 213-N and a respective capacitive element 211-1, . . . , 211-N. Additionally, each of the plurality of DAC cells 210-1, . . . , 210-N comprises a respective logic circuit 214-1, . . . , 214-N that enables to select the number of DAC cells contributing to the output signal of the DAC 200. In other words, by selecting the number of DAC cells that contribute to the output signal of the DAC, an amplitude of the DAC output signal may be adjusted. In order to avoid unnecessary repetitions, the functionality of the logic circuits 214-1, . . . , 214-N is explained below only with respect to logic circuit 214-1 of DAC cell 210-1. It is to be noted that the logic circuits 214-2, . . . , 214-N of the other DAC cells 210-2, . . . , 210-N operate accordingly.

The logic circuit 214-1 receives the phase modulated oscillation signal 201 from the synthesizer circuit 230. Further, the logic circuit 214-1 receives a control signal 203-1. In the example of FIG. 2, the logic circuit 214-1 is a NAND gate. However, the logic circuit 214-1 is not limited to this specific implementation. For example, the logic circuit 214-1 may be implemented using one or more other logic gates.

The logic circuit 214-1 selectively outputs an inverted oscillation signal 201' based on the control signal 203-1. While the control signal 203-1 represents the logic value 0 (low signal level), the output of the logic circuit 214-1 is a signal representing the logic value 1 (high signal level) irrespective of the signal value of the phase modulated oscillation signal 201. While the control signal 203-1 represents the logic value 1, the signal value of the phase modulated oscillation signal 201 is inverted by the logic circuit 214-1.

The inverter circuit 212-1 inverts the output of the logic circuit 214-1. Accordingly, while the control signal 203-1 represents the logic value 0, the inverter signal output by the inverter circuit 212-1 is constantly at low signal level. While the control signal 203-1 represents the logic value 1, the inverter signal output by the inverter circuit 212-1 changes between low and high signal level like the phase modulated oscillation signal 201. In other words, a constant first voltage is supplied to the capacitive element 211-1 while the control signal 203-1 represents the logic value 0, whereas the first voltage and a second voltage are alternatingly provided to the capacitive element 211-1 while the control signal 203-1 represents the logic value 1.

That is, the control signals 203-1, . . . , 203-N allow to select whether the first and the second voltage are alternatingly supplied to the capacitive element of the respective DAC cell 210-1, . . . , 210-N or the first voltage is constantly supplied to the capacitive element of the respective DAC cell 210-1, . . . , 210-N.

Selecting the number of DAC cells providing alternatingly the first and the second voltage to its capacitive element and selecting the number of DAC cells providing constantly the first voltage to its capacitive element may allow to adjust the output voltage provided at the output node 205 of the DAC 200. For example, the output voltage $V_{out}$ of the DAC 200 may be determined according to $$V_{out} = \frac{\sum C_i}{C_{tot}} \cdot (V_{first} - V_{second}), \quad (1)$$

wherein $C_{tot}$ is the total capacitance of the plurality of DAC cells 210-1, . . . , 210-N and $C_i$ is the capacitance of a capacitive element which is provided alternatingly with the first voltage $V_{first}$ and the second voltage $V_{second}$. In other words, the control signals 203-1, . . . , 203-N allow to (de-)activate individual DAC cells of the plurality of DAC cells 210-1, . . . , 210-N. For example, the number of active cells may be determined based on amplitude (radius) information contained in or derived from the data to be wirelessly transmitted. For example, the DAC 200 may comprise a decoder circuit configured to generate the control signals 203-1, . . . , 203-N based on the data to be wirelessly transmitted (e.g. amplitude information).

Although not explicitly illustrated in FIG. 1, according to various embodiments of the invention, the at least one DAC cell 110-i may be configured to comprise a logic circuit such as a NAND gate that receives the oscillation signal 101 and a control signal for the DAC cell 110-i. Similar to what is described above for DAC cell 210-1 of DAC 200, the logic circuit may selectively generate an inverted oscillation signal based on the control signal such that the inverter circuit may generate the inverter signal 102 based on the inverted oscillation signal. Accordingly, the DAC 100 may be configured to further comprise a decoder circuit configured to generate the control signal for the DAC cell 110-i based on digital input data (e.g. digital data to be wirelessly transmitted).

As described above in connection with FIG. 1, one or more DAC cells of the plurality of DAC cells may be implemented different from the above described DAC cells. For example, a DAC according to the proposed architecture may comprise a first number of thermometer coded DAC cells and a second number of binary coded DAC cells. While the thermometer coded DAC cells all exhibit the same drive strength, the drive strengths of the binary coded DAC cells are only fractions of the thermometer coded DAC cells' drive strength. An example of a binary coded DAC cell 310 is illustrated in FIG. 3.

Figure 3:
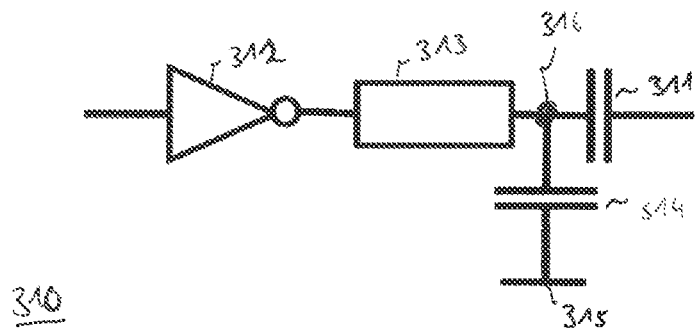
FIG. 3 illustrates an example of a DAC cell.

It can be seen from FIG. 3 that DAC cell 310 comprises a capacitive element 311, an inverter circuit 312 and a resistive element 313 like DAC cell 110-i and DAC cells 210-1, . . . , 210-N described above. For reasons of simplicity, DAC cell 310 is illustrated without any logic circuit. However, it is to be noted that the DAC cell 310 may comprise a logic circuit as described above for DAC cell 210-1.

In comparison to DAC cell 110-i, DAC cell 310 additionally comprises a further capacitive element 314 coupled between a first node 315 at ground potential and a second node 316 arranged between the resistive element 313 and the capacitive element 311.

A summed capacity of the further capacitive element 314 and the capacitive element 311 is equal to a capacity of the capacitive element 111 of the DAC cell 110-i. In other words, the capacitance of the capacitive element 111 in the DAC cell 110-i is divided into a wanted capacitance (capacitive element 311) and a parasitic capacitance (further capacitive element 314) for adjusting a drive strength of the DAC cell 310 to a fraction of the DAC cell 110-i's drive strength. For example, a capacitance of the capacitive element 311 may be ½, ¼, ⅛, 1/16, 1/32 or 1/64 of the capacitance of the capacitive element 111 in the DAC cell 110-i. Accordingly, a capacitance of the further capacitive element 314 may be ½, ¾, ⅞, 15/16, 31/32 or 63/64 of the capacitance of the capacitive element 111 in the DAC cell 110-i. The transient behavior of the DAC cell 310 is equal to the transient behavior of the DAC cell 110-i.

Referring back to DAC 100 illustrated in FIG. 1, the plurality of DAC cells 110-1, . . . , 110-N may comprises at least one DAC cell 110-i as described above and at least one DAC cell 310 as described above. The resistance of the resistive element 313 of the DAC cell 310 may be equal to the resistance of the resistive element 111 of the DAC cell 110-i.

For example, DAC 100 may comprises 1024 thermometer coded DAC cells that are implemented like DAC cell 110-i and 6 additional binary coded DAC cells that are implemented like DAC cell 310. For example, a respective capacitance of the six capacitive elements 311 may be ½, ¼, ⅛, 1/16, 1/32 and 1/64 of the capacitance of the capacitive element 111.

Figure 4:
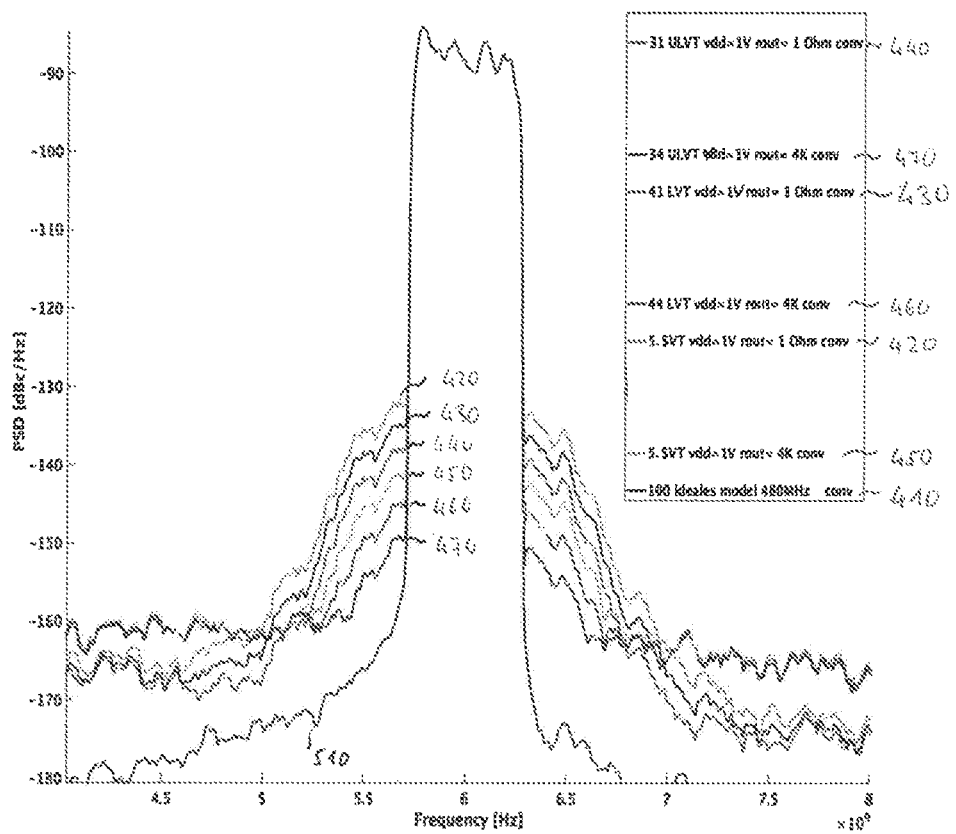
FIG. 4 illustrates an example of an output power spectrum of a DAC.
Figure 5:
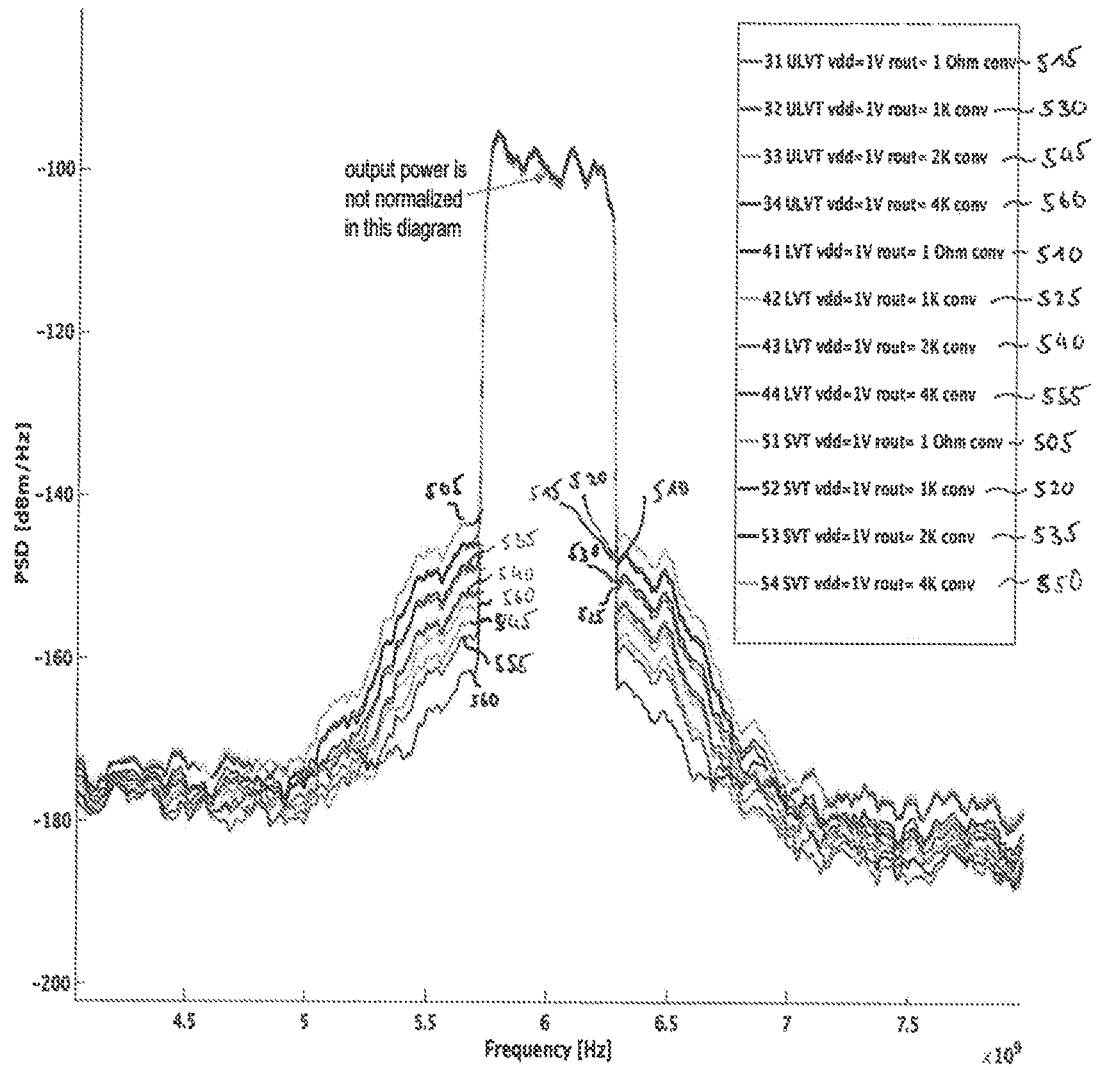

The effect of the proposed integration of resistive elements into the output stages of the DAC cells and the proposed usage of transistors with low threshold for the inverter circuits on the DAC linearity can be seen from FIGS. 4 and 5. FIG. 4 illustrates exemplary output power spectra of DACs according to the proposed architecture. In the example of FIG. 4, the DACs are driven with a 480 MHz data pattern (i.e. the DACs are operated as RFDACs).

Line 410 represents the ideal behavior of the DAC, i.e. the ideal output power spectrum of the DAC. Line 420 represents the output power spectrum if the resistive element exhibits a resistance of 1Ω and SVT transistors are used for the inverter circuit. Line 430 represents the output power spectrum if the resistive element exhibits a resistance of 1Ω and LVT transistors are used for the inverter circuit. Line 440 represents the output power spectrum if the resistive element exhibits a resistance of 1Ω and ULVT transistors are used for the inverter circuit.

Line 450 represents the output power spectrum if the resistive element exhibits a resistance of 4000Ω and SVT transistors are used for the inverter circuit. Line 460 represents the output power spectrum if the resistive element exhibits a resistance of 4000Ω and LVT transistors are used for the inverter circuit. Line 470 represents the output power spectrum if the resistive element exhibits a resistance of 4000Ω and ULVT transistors are used for the inverter circuit.

It can be seem from FIG. 4 that for the low resistance value, the DAC linearity increases by reducing the threshold voltage of the transistors of the inverter circuit. If the high resistance value is used instead of the low resistance value, the DAC linearity further increases. In the example of FIG. 4, the ACLR is improved by more than 15 dB due to the fast inverters and the resistive elements.

FIG. 5 illustrates further output power spectra of DACs according to the proposed architecture. Lines 505, 510 and 515 represent the output power spectrum if the resistive element exhibits a resistance of 1Ω and if the inverter circuit comprises a respective one of SVT, LVT and ULVT transistors. Lines 520, 525 and 530 represent the output power spectrum if the resistive element exhibits a resistance of 1000Ω and if the inverter circuit comprises a respective one of SVT, LVT and ULVT transistors. Lines 535, 540 and 545 represent the output power spectrum if the resistive element exhibits a resistance of 2000Ω and if the inverter circuit comprises a respective one of SVT, LVT and ULVT transistors. Lines 550, 555 and 560 represent the output power spectrum if the resistive element exhibits a resistance of 4000Ω and if the inverter circuit comprises a respective one of SVT, LVT and ULVT transistors.

Again, it can be seem from FIG. 5 that the DAC linearity increases by reducing the threshold voltage of the transistors of the inverter circuit. The DAC linearity further increases if the resistance of the resistive element is increased. In other words, examples of the present disclosure may enable a RFDAC with linearized output stage.

Further, it can be seen from the middle part of FIG. 5 that the output power of the wanted RF signal component slightly varies for the different resistance values. An ohmic resistance decreases the efficiency and the output power of a DAC cell. Accordingly, the resistive elements cause a reduction of the DAC's output power, which depends on the resistance value of the resistive elements. The higher the resistance, the higher is the decrease in DAC output power. However, on the other hand, nonlinearities in the RF output signal are reduced (e.g. by about 20 dB in the example of FIG. 5).

As can be seen from the RF transmit signal generation example of FIG. 5, the proposed DAC architecture may enable a 60 dB ACLR performance so that a very low EVM may be achieved. Although there is a loss in output power, the reduced nonlinearities may, e.g., allow to omit Digital Pre-Distortion (DPD), or to reduce the DPD complexity. Accordingly, the power required for generating an RF transmit signal may be reduced with the proposed linearization architecture compared to conventional approaches.

Figure 6:
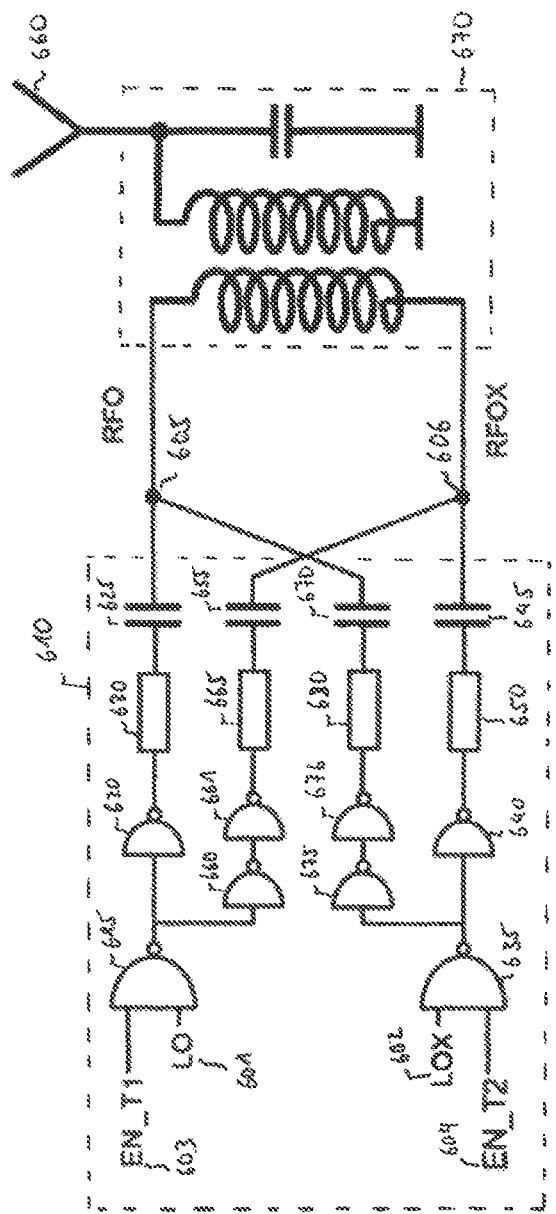
FIG. 6 illustrates another example of an output power spectrum of a DAC.

In the above examples, single-ended implementations of DACs and DAC cells were described. It is to be noted that, in some examples, the above described DACs and DAC cells may further be implemented in a differential manner. An example of a differential DAC cell 610 for a DAC according to the proposed architecture is illustrated in FIG. 6. In the example of FIG. 6, the DAC cell 610 is coupled to an antenna 660 via a matching circuit 670.

The DAC cell 610 comprises a first logic circuit 615 coupled to a first inverter circuit 620. The first inverter circuit 620 is coupled to a first capacitive element 625. A first resistive element 630 is coupled between the first inverter circuit 620 and the first capacitive element 625. The first capacitive element 625 is coupled to a first output node 605 of the DAC.

In the example of FIG. 6, the first logic circuit 615 is implemented as NAND gate. The first logic circuit 615 receives a first oscillation signal 601 and a first control signal 603. Based on the first control signal 603, the first logic circuit 615 selectively outputs a first inverted oscillation signal to the first inverter circuit 620 similar to what is described above in connection with FIG. 2 for DAC cell 210-1. The first inverter circuit 620 generates a first inverter signal based on the first inverted oscillation signal. The first inverted oscillation signal is supplied to the first capacitive element 625 and the first capacitive element 625 supplies a first analog output signal of the DAC cell 610 to the output node 605.

Further, the DAC cell 610 comprises a second logic circuit 635 coupled to a second inverter circuit 640. The second inverter circuit 640 is coupled to a second capacitive element 645. A second resistive element 650 is coupled between the second inverter circuit 640 and the second capacitive element 645. The second capacitive element 645 is coupled to a second output node 606 of the DAC.

Like the first logic circuit 635, the second logic circuit 635 is implemented as NAND gate. The second logic circuit 635 receives a second oscillation signal 602 and a second control signal 604. The second oscillation signal 602 is inverted with respect to the first oscillation signal 601. Further, the second control signal 604 is inverted with respect to the first control signal 603. Based on the second control signal 604, the second logic circuit 635 selectively outputs a second inverted oscillation signal to the second inverter circuit 640 similar to what is described above in connection with FIG. 2 for DAC cell 210-1. The second inverter circuit 640 generates a second inverter signal based on the second inverted oscillation signal. The second inverted oscillation signal is supplied to the second capacitive element 645 and the second capacitive element 645 supplies a second analog output signal of the DAC cell 610 to the second output node 606.

The resistance of the second resistive element 650 is equal to the resistance of the first resistive element 630, wherein the resistance of both resistive elements is at least son.

Additionally, the DAC cell 610 comprises a third capacitive element 655 configured to supply a third analog output signal of the DAC cell 610 to the second output node 606. A first pair of serially coupled inverter circuits 660, 661 is coupled to the third capacitive element 655. The first pair of inverter circuits outputs a third inverter signal for the third capacitive element 655 based on the first inverted oscillation selectively output by the first logic circuit 615. A third resistive element 665 is coupled between the first pair of inverter circuits 660, 661 and the third capacitive element 655. A resistance of the third resistive element 665 is equal to the resistance of the first resistive element 630.

Further, the DAC cell 610 comprises a fourth capacitive element 670 configured to supply a fourth analog output signal of the DAC cell 610 to the first output node 605. A second pair of serially coupled inverter circuits 675, 676 is coupled to the fourth capacitive element 670. The second pair of inverter circuits outputs a fourth inverter signal for the fourth capacitive element 670 based on the second inverted oscillation that is selectively output by the second logic circuit 635. A fourth resistive element 680 is coupled between the second pair of inverter circuits 675, 676 and the fourth capacitive element 670. A resistance of the fourth resistive element 680 is equal to the resistance of the first resistive element 630.

Accordingly, a differential pair of analog output signals may be provided with high linearity to the output nodes 605, 606.

Figure 7:
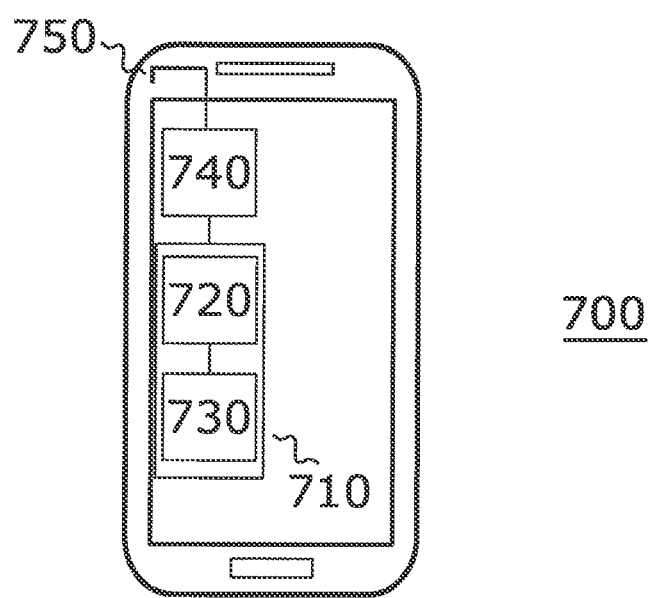
FIG. 7 illustrates an example of a mobile device comprising a DAC.

An example of an implementation using a DAC according to one or more aspects of the proposed technique or one or more examples described above is illustrated in FIG. 7. FIG. 7 schematically illustrates an example of a mobile device 700 (e.g. mobile phone, smartphone, tablet-computer, or laptop) comprising a transmitter or transceiver 710 (for simplicity it is only referred to a transmitter in the following). The transmitter 710 comprises a DAC 720 according to an example described herein. Further, the transmitter 710 comprises a synthesizer circuit 730 configured to generate the oscillation signal for the DAC 720 based on data to be wirelessly transmitted. For example, the synthesizer circuit 730 may be a modulated local oscillator or a Digital-to-Time Converter (DTC). However, the synthesizer circuit 730 is not limited to the aforementioned examples. The synthesizer circuit 730 may, e.g., generate the oscillation signal based on phase information contained in or derived from the data to be wirelessly transmitted.

The oscillation signal may be a (phase modulated) RF signal such that a frequency of the oscillation signal is, e.g., at least 100, 500, 1000, 1500, 2000 or 5000 MHz. Accordingly, the DAC 720 may be understood as an RFDAC that enables direct generation of a RF transmit signal. For example, the number of DAC cells that contribute to the output signal of the DAC 720 (i.e. the RF transmit signal) may be controlled by a decoder circuit (not illustrated) of the DAC 720 based on the data to be wirelessly transmitted. The decoder circuit may, e.g., control the number of DAC cells contributing to the output signal of the DAC 720 based on amplitude (or radius) information contained in or derived from the data to be wirelessly transmitted.

A matching circuit 740 is coupled to the output node of the DAC 720. The matching circuit 740 presents a defined inductance to the output node of the DAC 720 in order to maximize the power transfer from the output node of the DAC 720 to at least one antenna element 750 of the mobile device, and to minimize signal reflections from the at least one antenna element 750 back to the output node of the DAC 720.

The mobile device 700 may comprise further elements such as, e.g., an application processor, memory, an audio driver, a camera driver, a touch screen, a display driver, sensors, removable memory, a power management integrated circuit or a smart battery.

To this end, a mobile device enabling direct generation of an RF transmit signal with improved ACLR and low EVM may be provided. The improved RF transmit signal generation by the DAC 720 may allow to omit DPD in the transmit path so that a current consumption of the mobile device may be reduced compared to conventional techniques.

The above wireless communication circuits using a DAC according to the proposed technique or one or more of the examples described above may be configured to operate according to one of the 3$^{rd}$ Generation Partnership Project (3GPP)-standardized mobile communication networks or systems. The mobile or wireless communication system may correspond to, for example, a 5$^{th}$ Generation New Radio (5G NR), a Long-Term Evolution (LTE), an LTE-Advanced (LTE-A), High Speed Packet Access (HSPA), a Universal Mobile Telecommunication System (UMTS) or a UMTS Terrestrial Radio Access Network (UTRAN), an evolvedUTRAN (e-UTRAN), a Global System for Mobile communication (GSM), an Enhanced Data rates for GSM Evolution (EDGE) network, or a GSM/EDGE Radio Access Network (GERAN). Alternatively, the wireless communication circuits may be configured to operate according to mobile communication networks with different standards, for example, a Worldwide Inter-operability for Microwave Access (WIMAX) network IEEE 802.16 or Wireless Local Area Network (WLAN) IEEE 802.11, generally an Orthogonal Frequency Division Multiple Access (OFDMA) network, a Time Division Multiple Access (TDMA) network, a Code Division Multiple Access (CDMA) network, a Wideband-CDMA (WCDMA) network, a Frequency Division Multiple Access (FDMA) network, a Spatial Division Multiple Access (SDMA) network, etc.

The examples as described herein may be summarized as follows:

Example 1 is a DAC comprising a plurality of DAC cells coupled to an output node of the DAC, wherein at least one of the plurality of DAC cells comprises: a capacitive element configured to provide an analog output signal of the DAC cell to the output node; an inverter circuit coupled to the capacitive element, wherein the inverter circuit is configured to generate an inverter signal for the capacitive element based on an oscillation signal; and a resistive element coupled to the inverter circuit and the capacitive element, wherein a resistance of the resistive element is at least 50Ω.

Example 2 is the DAC of example 1, wherein the resistance of the resistive element is at least 500Ω.

Example 3 is the DAC of example 1 or example 2, wherein the resistive element is a thin film resistor.

Example 4 is the DAC of example 1 or example 2, wherein the resistive element is a polysilicon resistor.

Example 5 is the DAC of example 1 or example 2, wherein the resistive element is a transistor, and wherein a control gate of the transistor is configured to receive a control signal for adjusting a resistance between an input gate and an output gate of the transistor.

Example 6 is the DAC of any of examples 1 to 5, wherein the inverter circuit comprises at least two transistors serially coupled between a first potential and a second potential, wherein a threshold voltage of each of the at least two transistors is at maximum 25% of a potential difference between the first potential and the second potential.

Example 7 is the DAC of example 6, wherein the threshold voltage is at maximum 15% of the potential difference between the first potential and the second potential.

Example 8 is the DAC of any of examples 1 to 7, wherein no further inverter circuit is coupled between the inverter circuit and the capacitive element.

Example 9 is the DAC of any of examples 1 to 8, wherein the at least one of the plurality of DAC cells further comprises: a logic circuit coupled to the inverter circuit, wherein the logic circuit is configured to: receive the oscillation signal and a control signal; and selectively output an inverted oscillation signal based on the control signal, wherein the inverter circuit is configured to generate the inverter signal based on the inverted oscillation signal.

Example 10 is the DAC of example 9, wherein the logic circuit is a NAND gate.

Example 11 is the DAC of any of examples 1 to 10, wherein the at least one of the plurality of DAC cells further comprises: a second capacitive element configured to supply a second analog output signal of the DAC cell to a second output node of the DAC; a second inverter circuit coupled to the second capacitive element, wherein the second inverter circuit is configured to output a second inverter signal for the second capacitive element; and a second resistive element coupled between the second inverter circuit and the second capacitive element, wherein a resistance of the second resistive element is equal to the resistance of the resistive element.

Example 12 is the DAC of example 11, wherein the at least one of the plurality of DAC cells further comprises: a second logic circuit coupled to the second inverter circuit, wherein the second logic circuit is configured to: receive a second oscillation signal and a second control signal, wherein the second oscillation signal is inverted with respect to the oscillation signal, and wherein the second control signal is inverted with respect to the control signal; and selectively output a second inverted oscillation signal based on the second control signal, wherein the second inverter circuit is configured to generate the second inverter signal based on the second inverted oscillation signal.

Example 13 is the DAC of example 12, wherein the at least one of the plurality of DAC cells further comprises: a third capacitive element configured to supply a third analog output signal of the DAC cell to the second output node of the DAC; a pair of serially coupled inverter circuits, wherein the pair of inverter circuits is coupled to the third capacitive element, and wherein the pair of inverter circuits is configured to output a third inverter signal for the third capacitive element; and a third resistive element coupled between the pair of inverter circuits and the third capacitive element, wherein a resistance of the third resistive element is equal to the resistance of the resistive element.

Example 14 is the DAC of any of examples 1 to 13, wherein in comparison to the at least one of the plurality of DAC cells another one of the plurality of DAC cells additionally comprises: a further capacitive element coupled between a first node at ground potential and a second node arranged between the resistive element and the capacitive element of the other one of the plurality of DAC cells, wherein a summed capacity of the further capacitive element and the capacitive element of the other one of the plurality of DAC cells is equal to a capacity of the capacitive element of the at least one of the plurality of DAC cells.

Example 15 is the DAC of example 14, wherein a resistance of the resistive element of the other one of the plurality of DAC cells is equal to the resistance of the resistive element of the at least one of the plurality of DAC cells.

Example 16 is the DAC of any of examples 1 to 13, wherein the plurality of DAC cells are identical.

Example 17 is a transmitter, comprising: a DAC according to any of examples 1 to 16; and a synthesizer circuit configured to generate the oscillation signal based on data to be wirelessly transmitted.

Example 18 is the transmitter of example 17, wherein a frequency of the oscillation signal is at least 100 MHz.

Example 19 is a mobile device, comprising: a transmitter according to example 17 or example 18; and a matching circuit coupled to the output node of the DAC, wherein the matching circuit is configured to present a defined inductance to the output node of the DAC.

Example 20 is the mobile device of example 19, further comprising at least one antenna element coupled to the matching circuit.

The aspects and features mentioned and described together with one or more of the previously detailed examples and figures, may as well be combined with one or more of the other examples in order to replace a like feature of the other example or in order to additionally introduce the feature to the other example.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

A block diagram may, for instance, illustrate a high-level circuit diagram implementing the principles of the disclosure. Similarly, a flow chart, a flow diagram, a state transition diagram, a pseudo code, and the like may represent various processes, operations or steps, which may, for instance, be substantially represented in computer readable medium and so executed by a computer or processor, whether or not such computer or processor is explicitly shown. Methods disclosed in the specification or in the claims may be implemented by a device having means for performing each of the respective acts of these methods.

It is to be understood that the disclosure of multiple acts, processes, operations, steps or functions disclosed in the specification or claims may not be construed as to be within the specific order, unless explicitly or implicitly stated otherwise, for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

Furthermore, the following claims are hereby incorporated into the detailed description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are explicitly proposed herein unless it is stated that a specific combination is not intended. Furthermore, it is intended to include also features of a claim to any other independent claim even if this claim is not directly made dependent to the independent claim.

What is claimed is:

1. A digital-to-analog converter comprising a plurality of digital-to-analog converter cells coupled to an output node of the digital-to-analog converter, wherein at least one of the plurality of digital-to-analog converter cells comprises:
   a capacitive element configured to provide an analog output signal of the digital-to-analog converter cell to the output node;
   an inverter circuit coupled to the capacitive element, wherein the inverter circuit is configured to generate an inverter signal for the capacitive element based on an oscillation signal; and
   a resistive element coupled between the inverter circuit and the capacitive element, wherein a resistance of the resistive element is at least 50Ω.

2. The digital-to-analog converter of claim 1, wherein the resistance of the resistive element is at least 500Ω.

3. The digital-to-analog converter of claim 1, wherein the resistive element is a thin film resistor.

4. The digital-to-analog converter of claim 1, wherein the resistive element is a polysilicon resistor.

5. The digital-to-analog converter of claim 1, wherein the resistive element is a transistor, and wherein a control gate of the transistor is configured to receive a control signal for adjusting a resistance between an input gate and an output gate of the transistor.

6. The digital-to-analog converter of claim 1, wherein the inverter circuit comprises at least two transistors that are stacked serially and coupled between a first potential and a second potential, wherein a threshold voltage of each of the at least two transistors is at maximum 25% of a potential difference between the first potential and the second potential.

7. The digital-to-analog converter of claim 6, wherein the threshold voltage is at maximum 15% of the potential difference between the first potential and the second potential.

8. The digital-to-analog converter of claim 1, wherein no further inverter circuit is coupled between the inverter circuit and the capacitive element.

9. The digital-to-analog converter of claim 1, wherein the at least one of the plurality of digital-to-analog converter cells further comprises:
a logic circuit coupled to the inverter circuit, wherein the logic circuit is configured to:
receive the oscillation signal and a control signal; and
selectively output an inverted oscillation signal based on the control signal,
wherein the inverter circuit is configured to generate the inverter signal based on the inverted oscillation signal.

10. The digital-to-analog converter of claim 9, wherein the logic circuit is a NAND gate.

11. The digital-to-analog converter of claim 1, wherein the at least one of the plurality of digital-to-analog converter cells further comprises:
a second capacitive element configured to supply a second analog output signal of the digital-to-analog converter cell to a second output node of the digital-to-analog converter;
a second inverter circuit coupled to the second capacitive element, wherein the second inverter circuit is configured to output a second inverter signal for the second capacitive element; and
a second resistive element coupled between the second inverter circuit and the second capacitive element, wherein a resistance of the second resistive element is equal to the resistance of the resistive element.

12. The digital-to-analog converter of claim 11, wherein the at least one of the plurality of digital-to-analog converter cells further comprises:
a second logic circuit coupled to the second inverter circuit, wherein the second logic circuit is configured to:
receive a second oscillation signal and a second control signal, wherein the second oscillation signal is inverted with respect to the oscillation signal, and
wherein the second control signal is inverted with respect to the control signal; and
selectively output a second inverted oscillation signal based on the second control signal,
wherein the second inverter circuit is configured to generate the second inverter signal based on the second inverted oscillation signal.

13. The digital-to-analog converter of claim 12, wherein the at least one of the plurality of digital-to-analog converter cells further comprises:
a third capacitive element configured to supply a third analog output signal of the digital-to-analog converter cell to the second output node of the digital-to-analog converter;
a pair of serially coupled inverter circuits, wherein the pair of inverter circuits is coupled to the third capacitive element, and wherein the pair of inverter circuits is configured to output a third inverter signal for the third capacitive element; and
a third resistive element coupled between the pair of inverter circuits and the third capacitive element, wherein a resistance of the third resistive element is equal to the resistance of the resistive element.

14. The digital-to-analog converter of claim 1, wherein in comparison to the at least one of the plurality of digital-to-analog converter cells another one of the plurality of digital-to-analog converter cells additionally comprises:
a further capacitive element coupled between a first node at ground potential and a second node arranged between the resistive element and the capacitive element of the other one of the plurality of digital-to-analog converter cells,
wherein a summed capacity of the further capacitive element and the capacitive element of the other one of the plurality of digital-to-analog converter cells is equal to a capacity of the capacitive element of the at least one of the plurality of digital-to-analog converter cells.

15. The digital-to-analog converter of claim 14, wherein a resistance of the resistive element of the other one of the plurality of digital-to-analog converter cells is equal to the resistance of the resistive element of the at least one of the plurality of digital-to-analog converter cells.

16. The digital-to-analog converter of claim 1, wherein the plurality of digital-to-analog converter cells are identical.

17. A transmitter, comprising:
a digital-to-analog converter according to claim 1; and
a synthesizer circuit configured to generate the oscillation signal based on data to be wirelessly transmitted.

18. The transmitter of claim 17, wherein a frequency of the oscillation signal is at least 100 MHz.

19. A mobile device, comprising:
a transmitter according to claim 17; and
a matching circuit coupled to the output node of the digital-to-analog converter, wherein the matching circuit is configured to present a defined inductance to the output node of the digital-to-analog converter.

20. The mobile device of claim 19, further comprising at least one antenna element coupled to the matching circuit.

* * * * *